US009978864B2

(12) United States Patent
Liu et al.

(10) Patent No.: US 9,978,864 B2
(45) Date of Patent: May 22, 2018

(54) SEMICONDUCTOR DEVICE AND METHOD FOR MANUFACTURING THE SAME

(71) Applicant: Vanguard International Semiconductor Corporation, Hsinchu (TW)

(72) Inventors: Tse-Hsiao Liu, Hsinchu (TW); Sing-Lin Wu, Taichung (TW); Chung-Hsuan Wang, Taoyuan (TW); Yung-Lung Chou, Hsinchu (TW); Chia-Hao Lee, New Taipei (TW); Chih-Cherng Liao, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 26 days.

(21) Appl. No.: 14/958,538

(22) Filed: Dec. 3, 2015

(65) Prior Publication Data
US 2017/0162691 A1    Jun. 8, 2017

(51) Int. Cl.
*H01L 29/78*    (2006.01)
*H01L 29/66*    (2006.01)

(52) U.S. Cl.
CPC ...... *H01L 29/7833* (2013.01); *H01L 29/6659* (2013.01); *H01L 29/66659* (2013.01); *H01L 29/7835* (2013.01)

(58) Field of Classification Search
CPC ............. H01L 29/7833; H01L 29/7835; H01L 29/7836; H01L 29/6659
See application file for complete search history.

(56) References Cited

U.S. PATENT DOCUMENTS

| 8,080,845 | B2 * | 12/2011 | Shima | H01L 29/0847 257/336 |
| 9,048,252 | B2 * | 6/2015 | Sakamoto | H01L 21/823412 |
| 2005/0104138 | A1 * | 5/2005 | Nishibe | H01L 21/26513 257/408 |
| 2006/0006434 | A1 * | 1/2006 | Maeda | H01L 21/26586 257/288 |
| 2012/0061767 | A1 * | 3/2012 | Hirano | H01L 21/823418 257/369 |
| 2013/0241005 | A1 * | 9/2013 | Shima | H01L 21/823418 257/401 |

FOREIGN PATENT DOCUMENTS

TW    200849403 A    12/2008

* cited by examiner

*Primary Examiner* — Benjamin Sandvik
(74) *Attorney, Agent, or Firm* — Birch, Stewart, Kolasch & Birch, LLP

(57) ABSTRACT

A semiconductor device is provided. The semiconductor device includes a substrate including a first conductive type well region; a gate structure; a lightly-doped drain region and a lightly-doped source region disposed at two opposite sides of the gate structure; a second conductive type first doped region disposed in the lightly-doped drain region, wherein the doping concentration of the second conductive type first doped region is less than the doping concentration of the lightly-doped drain region; a heavily-doped source region disposed in the lightly-doped source region; and a heavily-doped drain region disposed in the second conductive type first doped region. The present disclosure also provides a method for manufacturing the semiconductor device.

20 Claims, 10 Drawing Sheets

SEMICONDUCTOR DEVICE AND METHOD FOR MANUFACTURING THE SAME

BACKGROUND

Technical Field

The disclosure relates to a semiconductor device and a method for manufacturing the same, and in particular to a semiconductor device having a drain region and a method for manufacturing the same.

Description of the Related Art

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

The semiconductor integrated circuit industry has produced numerous developments in an effort to continue the scaling-down process. However, as the size of the smallest component has decreased, numerous challenges have arisen. Therefore, the existing semiconductor devices have not been satisfactory in every respect.

Therefore, a semiconductor device with higher structural reliability and a method for manufacturing the same are needed.

SUMMARY

The present disclosure provides a semiconductor device, including a substrate, a gate structure, a lightly-doped drain region and a lightly-doped source region, a second conductive type first doped region, a spacer, a heavily-doped source region, and a heavily-doped drain region. The substrate includes a first conductive type well region. The gate structure is disposed over the main surface of the substrate. The lightly-doped drain region and the lightly-doped source region are disposed in the first conductive type well region at two opposite sides of the gate structure. The lightly-doped drain region and the lightly-doped source region have a second conductive type, which is different from the first conductive type. The second conductive type first doped region is disposed in the lightly-doped drain region and has the second conductive type. The doping concentration of the second conductive type first doped region is less than the doping concentration of the lightly-doped drain region. The spacer is disposed at the two opposite sides of the gate structure. The heavily-doped source region is disposed in the lightly-doped source region and has the second conductive type. The heavily-doped drain region is disposed in the second conductive type first doped region and has the second conductive type.

The present disclosure also provides a method for manufacturing a semiconductor device, including: providing a substrate, wherein the substrate includes a first conductive type well region; forming a gate structure over a main surface of the substrate; forming a lightly-doped drain region and a lightly-doped source region in the first conductive type well region at two opposite sides of the gate structure, wherein the lightly-doped drain region and the lightly-doped source region have a second conductive type, and the second conductive type is different from the first conductive type; forming a second conductive type first doped region in the lightly-doped drain region, wherein the second conductive type first doped region has the second conductive type, and the doping concentration of the second conductive type first doped region is less than the doping concentration of the lightly-doped drain region; forming a spacer at the two opposite sides of the gate structure; forming a heavily-doped source region in the lightly-doped source region, wherein the heavily-doped source region has the second conductive type; and forming a heavily-doped drain region in the second conductive type first doped region, wherein the heavily-doped drain region has the second conductive type.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
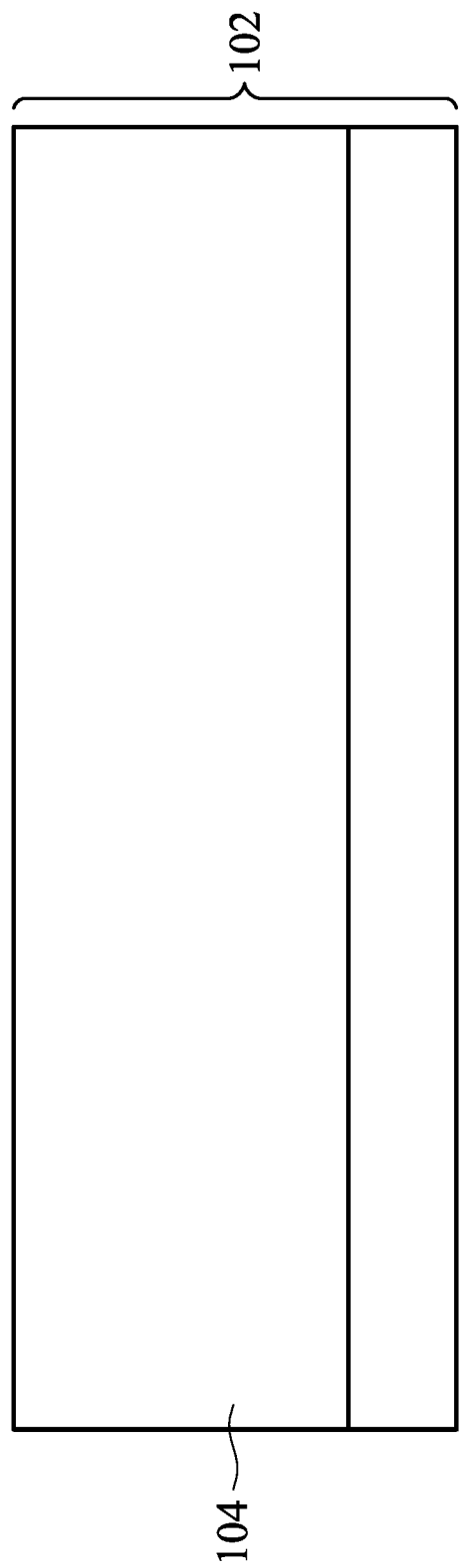
FIG. 1A is a cross-sectional view of a semiconductor device in one step of a manufacturing method of the semiconductor device in accordance with some embodiments of the present disclosure.

The semiconductor device of the present disclosure and the method for manufacturing this semiconductor device are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a semiconductor wafer and the layers overlying the wafer. All needed semiconductor elements may already be formed over the substrate. However, the substrate is represented as having a flat surface in order to simplify the drawing. The term "substrate surface" is meant to include the uppermost exposed layers on a semiconductor wafer, such as a silicon surface, and insulating layer and/or metallurgy lines.

Generally speaking, as the size of the semiconductor device decreases, the substrate current resulting from the hot carrier effect in the device may increase. This substrate current may damage the elements in the device and thus lower the structural reliability of the semiconductor device.

The embodiment of the present disclosure forms a doped region in the lightly-doped drain region, wherein the doped region has a doping concentration that is less than the doping concentration of the lightly-doped drain region, and thereby enlarges the area of the depletion region between the lightly-doped drain region and the well region of the substrate in the device. The enlargement the area of the depletion region may decrease the changing rate of the electric field in one unit width in the device, which in turn decreases the substrate current resulting from the hot carrier effect. Therefore, the damage to the elements (for example the gate dielectric layer) in the device resulting from the substrate current may be reduced, which in turn increases the structural reliability of the semiconductor device.

FIG. 1A is a cross-sectional view of a semiconductor device in one step of a manufacturing method of the semiconductor device in accordance with some embodiments of the present disclosure. Referring to FIG. 1A, a substrate 102 is provided. The substrate 102 includes a first conductive type well region 104.

The substrate 102 may include, but is not limited to, semiconductor substrate such as a silicon substrate. In addition, the substrate 102 may include an element semiconductor which may include germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy; or a combination thereof. In addition, the substrate 102 may include a semiconductor-on-insulator.

The first conductive type well region 104 may be formed by ion implantation. For example, when the second conductive type is P-type, the predetermined region for the first conductive type well region 104 may be implanted with boron ion or indium ion to form the first conductive type well region 104. In some embodiments, the doping concentration of the first conductive type well region 104 may be from about $10^{16}/cm^3$ to about $10^{18}/cm^3$, for example about $10^{17}/cm^3$.

Figure 1B:
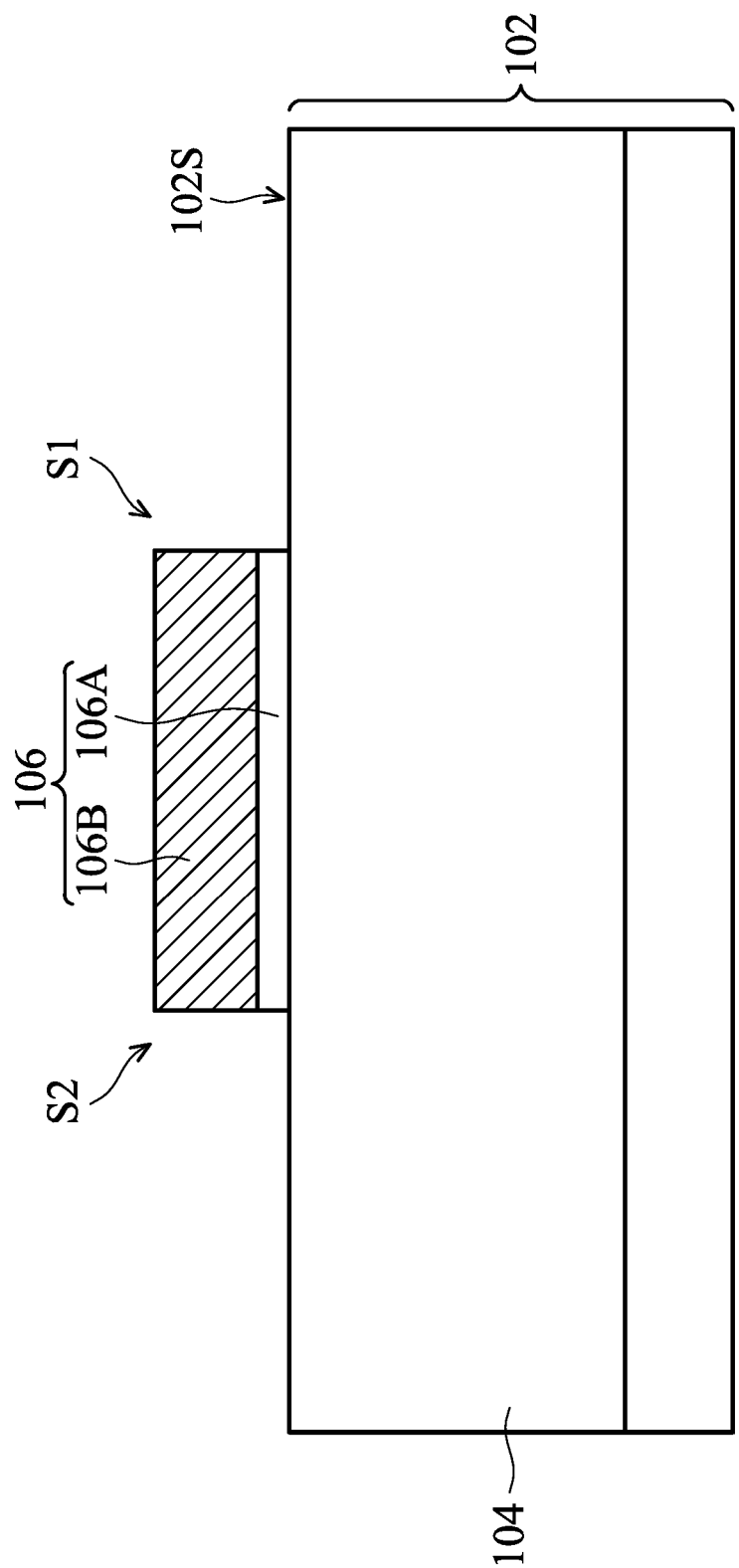
FIG. 1B is a cross-sectional view of a semiconductor device in one step of a manufacturing method of the semiconductor device in accordance with some embodiments of the present disclosure.

FIG. 1B is a cross-sectional view of a semiconductor device in one step of a manufacturing method of the semiconductor device in accordance with some embodiments of the present disclosure. Referring to FIG. 1B, a gate structure 106 is formed over the main surface 102S of the substrate 102. In other words, the gate structure 106 is formed over the first conductive type well region 104. The gate structure 106 includes a gate dielectric layer 106A and a gate electrode 106B disposed over the gate dielectric layer 106A. In some embodiments, a dielectric material layer and a conductive material layer thereon may be blanketly deposited over the main surface 102S of the substrate 102 sequentially. Subsequently, the gate dielectric layer 106A and the gate electrode 106B are respectively formed from the dielectric material layer and the conductive material layer by patterning the above two layers through photolithography and etching steps.

The material of the dielectric material layer (i.e. the material of the gate dielectric layer 106A) may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof. The dielectric material layer may be formed by chemical vapor deposition or spin-on coating. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method. For example, in some embodiments, the material of the dielectric material layer (i.e. the material of the gate dielectric layer 106A) may include silicon oxide, boron phosphorus silicon glass (BPSG), phosphorus silicon glass (PSG), spin-on glass (SOG) formed by plasma enhanced chemical vapor deposition (PECVD), or may include silicon oxide formed by high-density plasma deposition, or may include silicon oxide formed by ozone-tetraethyl orthosilicate ($O_3$-TEOS) deposition.

The material of the conductive material layer (i.e. the material of the gate electrode 106B) may include, but is not limited to, amorphous silicon, poly-silicon, one or more metals, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by the previously described chemical vapor deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition at about 525° C.~575° C. The thickness of the amorphous silicon conductive material layer or poly-silicon conductive material layer may range from about 1000 Å to 5000 Å.

Then, a metal silicidation step may optionally be performed to form a metal silicide layer (not shown) at the top surface of the gate electrode 106B. The material of the metal silicide layer may include, but is not limited to, nickel silicide, cobalt silicide, tungsten silicide, titanium silicide, tantalum silicide, platinum silicide or erbium silicide.

Figure 1C:
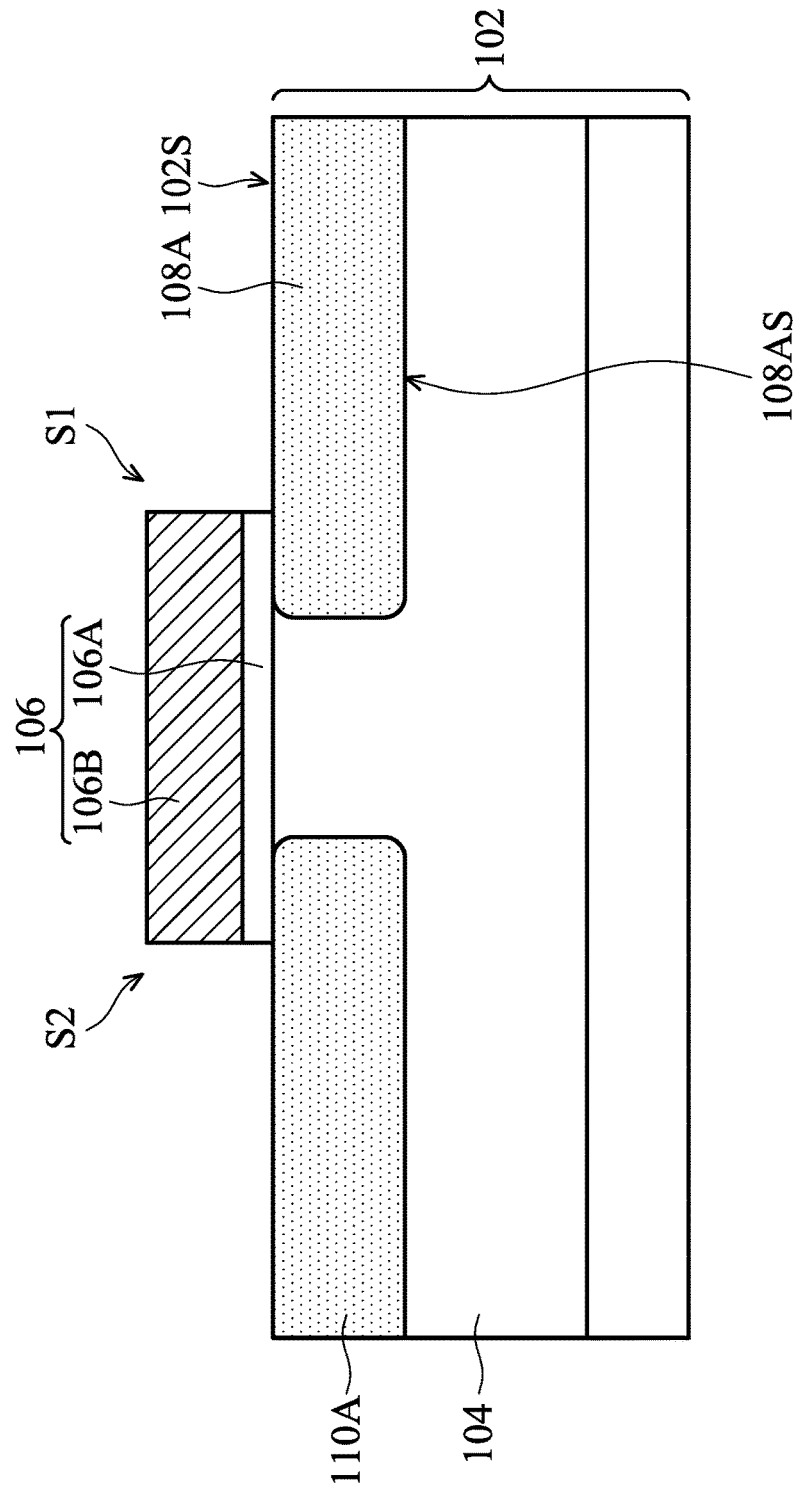
FIG. 1C is a cross-sectional view of a semiconductor device in one step of a manufacturing method of the semiconductor device in accordance with some embodiments of the present disclosure.

FIG. 1C is a cross-sectional view of a semiconductor device in one step of a manufacturing method of the semiconductor device in accordance with some embodiments of the present disclosure. As shown in FIG. 1C, a lightly-doped drain region 108A and a lightly-doped source region 110A are formed. The lightly-doped drain region 108A and the lightly-doped source region 110A are disposed in the first conductive type well region 104 at two opposite sides S1 and S2 of the gate structure 106. The lightly-doped drain region 108A and the lightly-doped source region 110A have a second conductive type, and the second conductive type is different from the first conductive type.

The lightly-doped drain region 108A and the lightly-doped source region 110A may be formed by ion implantation. For example, in some embodiments, when the second conductive type is N-type, the predetermined region in the substrate 102 for the lightly-doped drain region 108A and the lightly-doped source region 110A may be implanted with phosphorous ions or arsenic ions to form the lightly-doped drain region 108A and the lightly-doped source region 110A.

In addition, the lightly-doped drain region 108A and the lightly-doped source region 110A both extend from the main surface 102S of the substrate 102 into the first conductive type well region 104. In addition, in some embodiments, the doping concentration of the lightly-doped drain region 108A may be from about $10^{16}/cm^3$ to about $10^{18}/cm^3$, for example about $10^{17}/cm^3$, and the doping concentration of the lightly-doped source region 110A may be from about $10^{16}/cm^3$ to about $10^{18}/cm^3$, for example about $10^{17}/cm^3$.

Figure 1D:
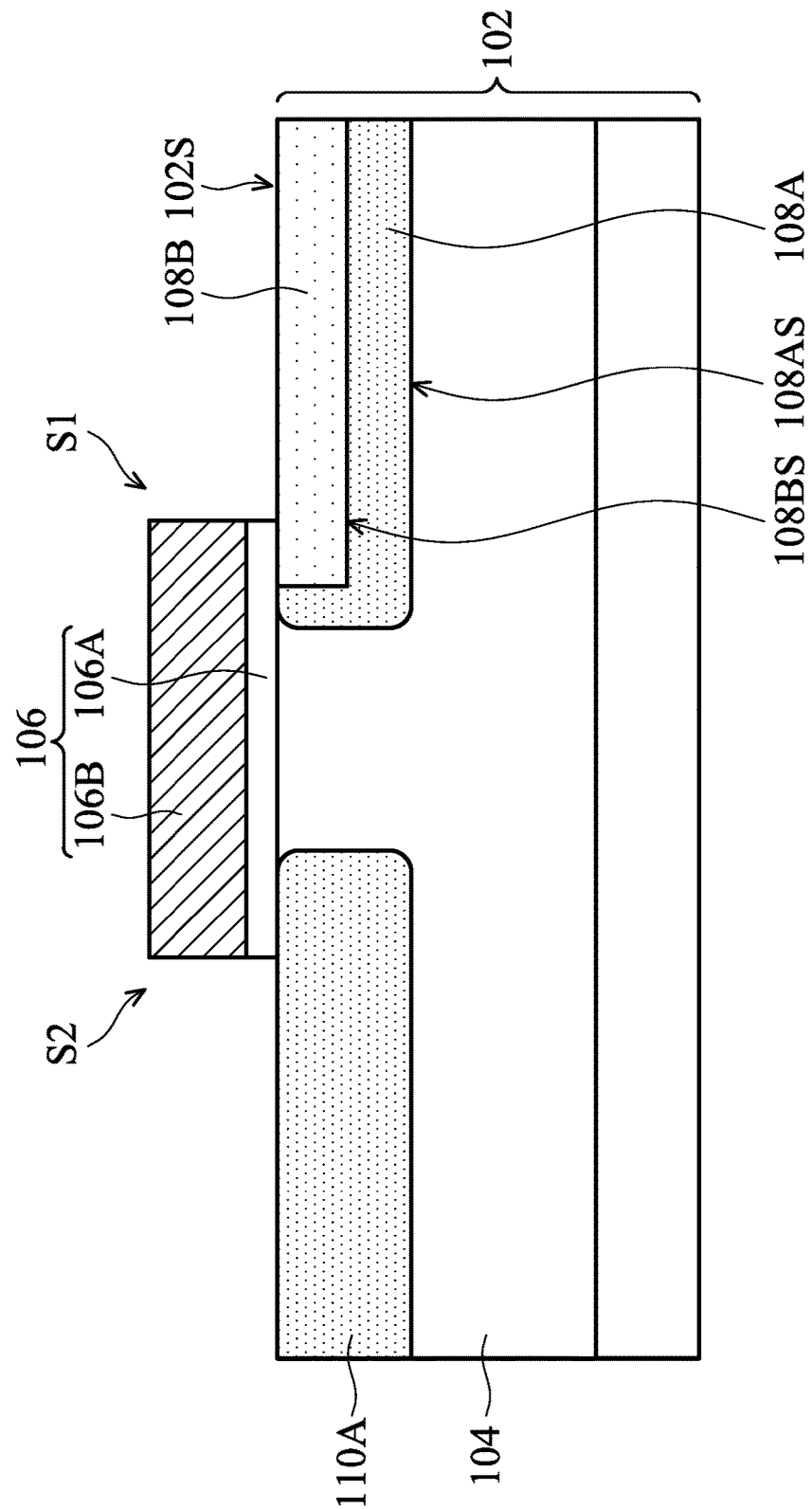
FIG. 1D is a cross-sectional view of a semiconductor device in one step of a manufacturing method of the semiconductor device in accordance with some embodiments of the present disclosure.

FIG. 1D is a cross-sectional view of a semiconductor device in one step of a manufacturing method of the semiconductor device in accordance with some embodiments of the present disclosure. As shown in FIG. 1D, a second conductive type first doped region 108B is formed in the lightly-doped drain region 108A. The second conductive type first doped region 108B has the second conductive type, and the doping concentration of the second conductive type first doped region 108B is less than the doping concentration of the lightly-doped drain region 108A.

In some embodiments, when the second conductive type is N-type, the predetermined region in the substrate 102 for the second conductive type first doped region 108B may be implanted with P-type dopant (first conductive type dopant) such as boron ion or indium ion to form the second conductive type first doped region 108B.

In some embodiments, the doping concentration of the second conductive type first doped region 108B may be from about $10^{15}/cm^3$ to about $10^{17}/cm^3$, for example about $10^{16}/cm^3$. It should be noted that, in the present disclosure, the doping concentration of the second conductive type first doped region 108B is referred to as the equivalent concentration of the second conductive type dopant in this region. In other words, the doping concentration of the second conductive type first doped region 108B is equal to the doping concentration of the second conductive type dopant of the lightly-doped drain region 108A minus the concentration of the first conductive type dopant doped in the step for forming the second conductive type first doped region 108B.

In addition, in some embodiments, as shown in FIG. 1D, the second conductive type first doped region 108B extends from the main surface 102S of the substrate 102 into the lightly-doped drain region 108A. In addition, in some embodiments, the lightly-doped drain region 108A and the second conductive type first doped region 108B both extend into the first conductive type well region 104 under the gate structure 106.

In addition, in some embodiments, as shown in FIG. 1D, the lightly-doped drain region 108A completely encloses the second conductive type first doped region 108B. In other words, except for the sidewalls and the main surface 102S of the substrate 102, the side 108BS of the second conductive type first doped region 108B does not contact the side 108AS of the lightly-doped drain region 108A.

Figure 1E:
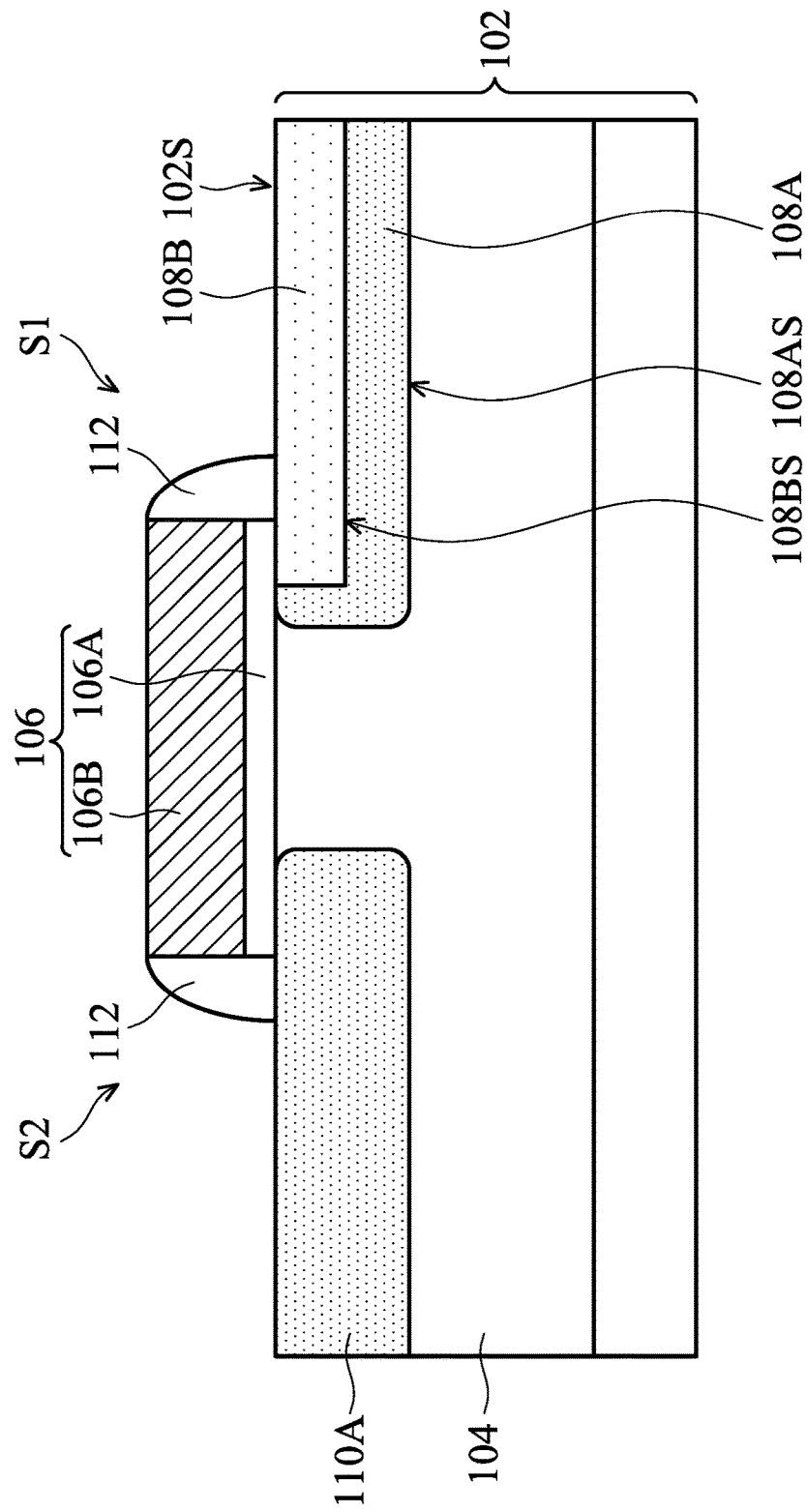
FIG. 1E is a cross-sectional view of a semiconductor device in one step of a manufacturing method of the semiconductor device in accordance with some embodiments of the present disclosure.

FIG. 1E is a cross-sectional view of a semiconductor device in one step of a manufacturing method of the semiconductor device in accordance with some embodiments of the present disclosure. As shown in FIG. 1E, a spacer 112 is formed at the two opposite sides S1 and S2 of the gate structure 106. The material of the spacer 112 may include, but is not limited to, silicon oxide/silicon nitride/silicon oxide (ONO), silicon nitride/silicon oxide (NO), silicon oxide or silicon nitride. The spacer 112 may be formed by the previously described chemical vapor deposition.

Figure 1F:
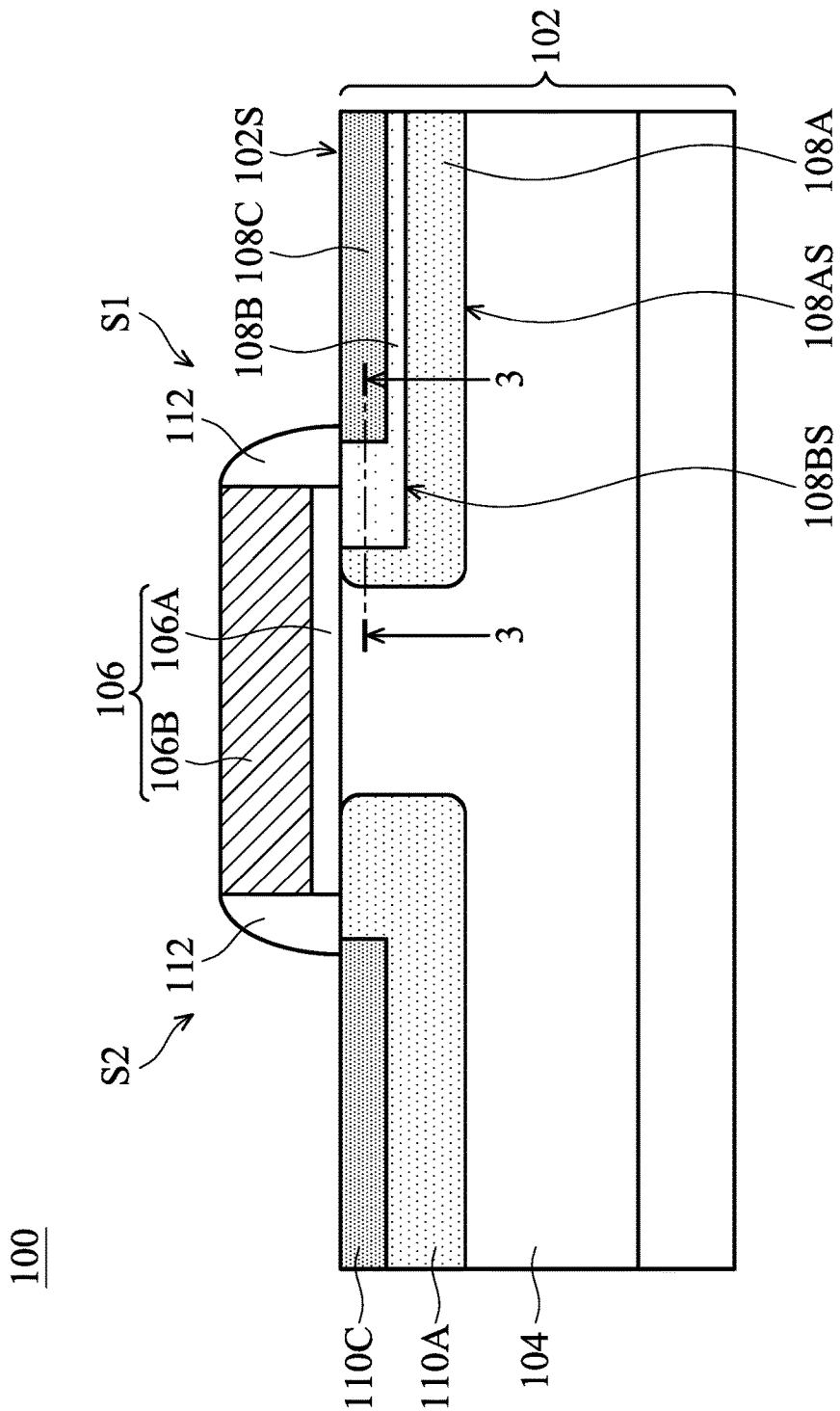
FIG. 1F is a cross-sectional view of a semiconductor device in one step of a manufacturing method of the semiconductor device in accordance with some embodiments of the present disclosure.

FIG. 1F is a cross-sectional view of a semiconductor device 100 in one step of a manufacturing method of the semiconductor device 100 in accordance with some embodiments of the present disclosure. As shown in FIG. 1F, a heavily-doped source region 110C is formed in the lightly-doped source region 110A, and a heavily-doped drain region 108C is formed in the second conductive type first doped region 108B. The heavily-doped source region 110C and the heavily-doped drain region 108C have the second conductive type.

In some embodiments, when the second conductive type is N-type, the predetermined region in the substrate 102 for the heavily-doped source region 110C and the heavily-doped drain region 108C may be implanted with phosphorous ions or arsenic ions to form the heavily-doped source region 110C and the heavily-doped drain region 108C.

In addition, in some embodiments, as shown in FIG. 1F, the heavily-doped source region 110C and the heavily-doped drain region 108C extend from the main surface 102S of the substrate 102 into the lightly-doped source region 110A and the second conductive type first doped region 108B, respectively. In addition, in some embodiments, the heavily-doped source region 110C and the heavily-doped drain region 108C both extend into the first conductive type well region 104 under the spacer 112, but both do not extend into the first conductive type well region 104 under the gate structure 106.

In addition, in some embodiments, as shown in FIG. 1F, the second conductive type first doped region 108B completely encloses the heavily-doped drain region 108C.

In some embodiments, the doping concentration of the heavily-doped drain region 108C may be from about $10^{19}/cm^3$ to about $10^{21}/cm^3$, for example about $10^{20}/cm^3$. The doping concentration of the heavily-doped source region 110O may be from about $10^{19}/cm^3$ to about $10^{21}/cm^3$, for example about $10^{20}/cm^3$. In other words, the doping concentration of the heavily-doped drain region 108C is greater than the doping concentration of the lightly-doped drain region 108A, and the doping concentration of the lightly-doped drain region 108A is greater than the doping concentration of the second conductive type first doped region 108B.

The embodiment of the present disclosure forms a second conductive type first doped region 108B in the lightly-doped drain region 108A in the semiconductor device 100, wherein the second conductive type first doped region 108B has a doping concentration that is less than the doping concentration of the lightly-doped drain region 108A, and thereby enlarges the area of the depletion region between the lightly-doped drain region 108A and the first conductive type well region 104 of the substrate in the device. The enlargement the area of the depletion region may decrease the changing rate of the electric field in one unit width in the semiconductor device 100, which in turn decreases the substrate current resulting from the hot carrier effect. Therefore, the damage to the elements (for example the gate dielectric layer 106A) in the device resulting from the substrate current may be reduced, which in turn increases the structural reliability of the semiconductor device 100.

In some embodiments, the doping concentration of the second conductive type first doped region 108B is about 0.8-0.001 times the doping concentration of the lightly-doped drain region 108A, for example about 0.08-0.03 times the doping concentration of the lightly-doped drain region 108A. It should be noted that, if the second conductive type first doped region 108B is too great, for example greater than 0.8 times the doping concentration of the lightly-doped drain region 108A, the second conductive type first doped region 108B cannot effectively enlarge the area of the depletion region. However, if the second conductive type first doped region 108B is too small, for example smaller than 0.001 times the doping concentration of the lightly-doped drain region 108A, the internal resistance of the semiconductor device 100 would increase.

Still referring to FIG. 1F, the embodiment of the present disclosure provides a semiconductor device 100. The semiconductor device 100 includes a substrate 102, and the substrate 102 includes a first conductive type well region 104. The semiconductor device 100 further includes a gate structure 106 disposed over a main surface 102S of the substrate 102, and includes a lightly-doped drain region 108A and a lightly-doped source region 110A. The lightly-doped drain region 108A and lightly-doped source region 110A disposed in the first conductive type well region 104 at two opposite sides S1 and S2 of the gate structure 106. The lightly-doped drain region 108A and the lightly-doped source region 110A have a second conductive type, wherein the second conductive type is different from the first conductive type.

The semiconductor device 100 further includes a second conductive type first doped region 108B disposed in the lightly-doped drain region 108A. The second conductive type first doped region 108B has the second conductive type, and the doping concentration of the second conductive type first doped region 108B is less than the doping concentration of the lightly-doped drain region 108A.

The semiconductor device 100 further includes a spacer 112 disposed at the two opposite sides S1 and S2 of the gate structure 106. The semiconductor device 100 further includes a heavily-doped source region 110C disposed in the lightly-doped source region 110A and a heavily-doped drain region 108C disposed in the second conductive type first doped region 108B. The heavily-doped drain region 108C and the heavily-doped source region 110C have the second conductive type.

Figure 2A:
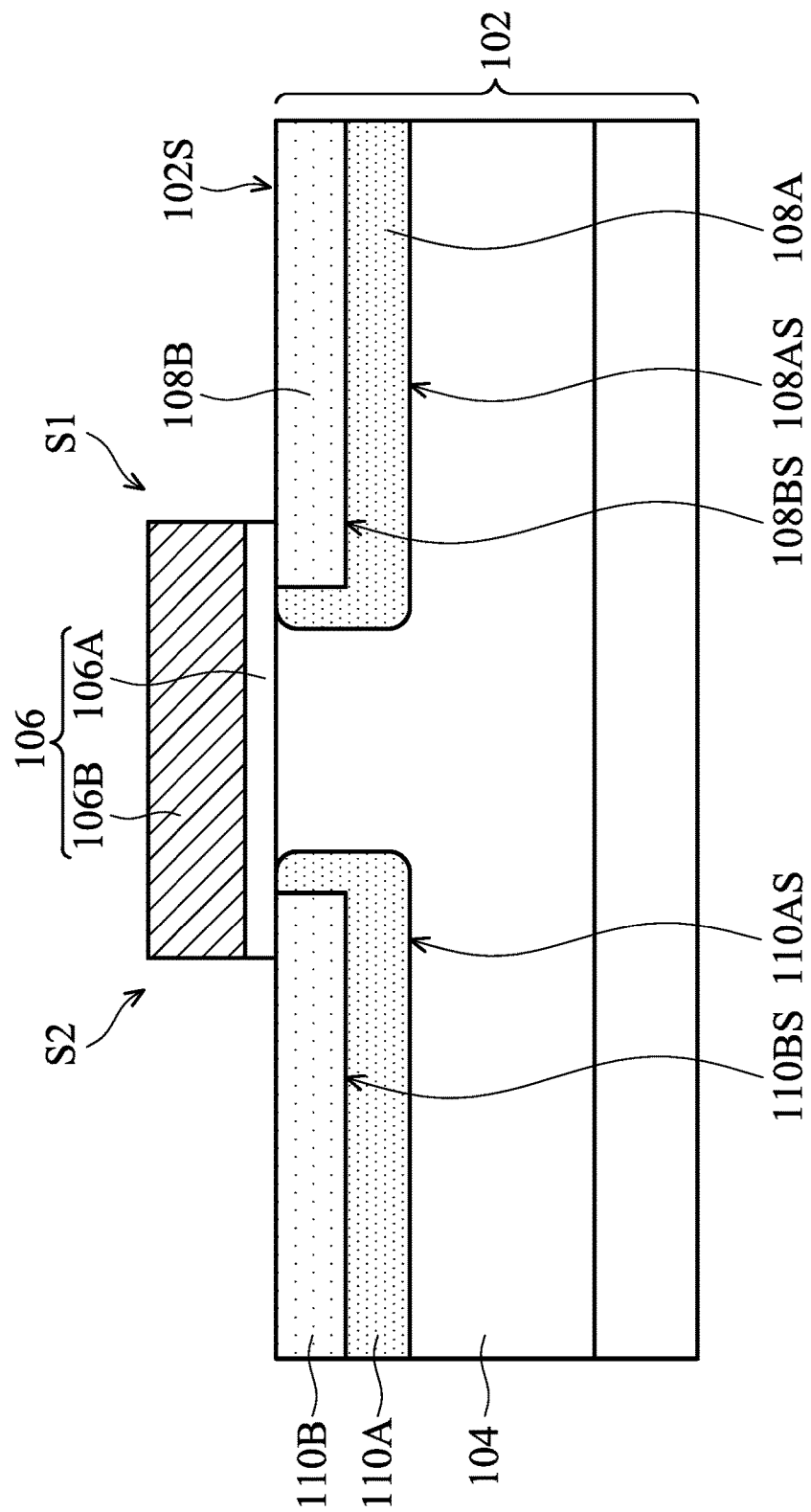
FIG. 2A is a cross-sectional view of a semiconductor device in one step of a manufacturing method of the semiconductor device in accordance with another embodiment of the present disclosure.
Figure 2B:
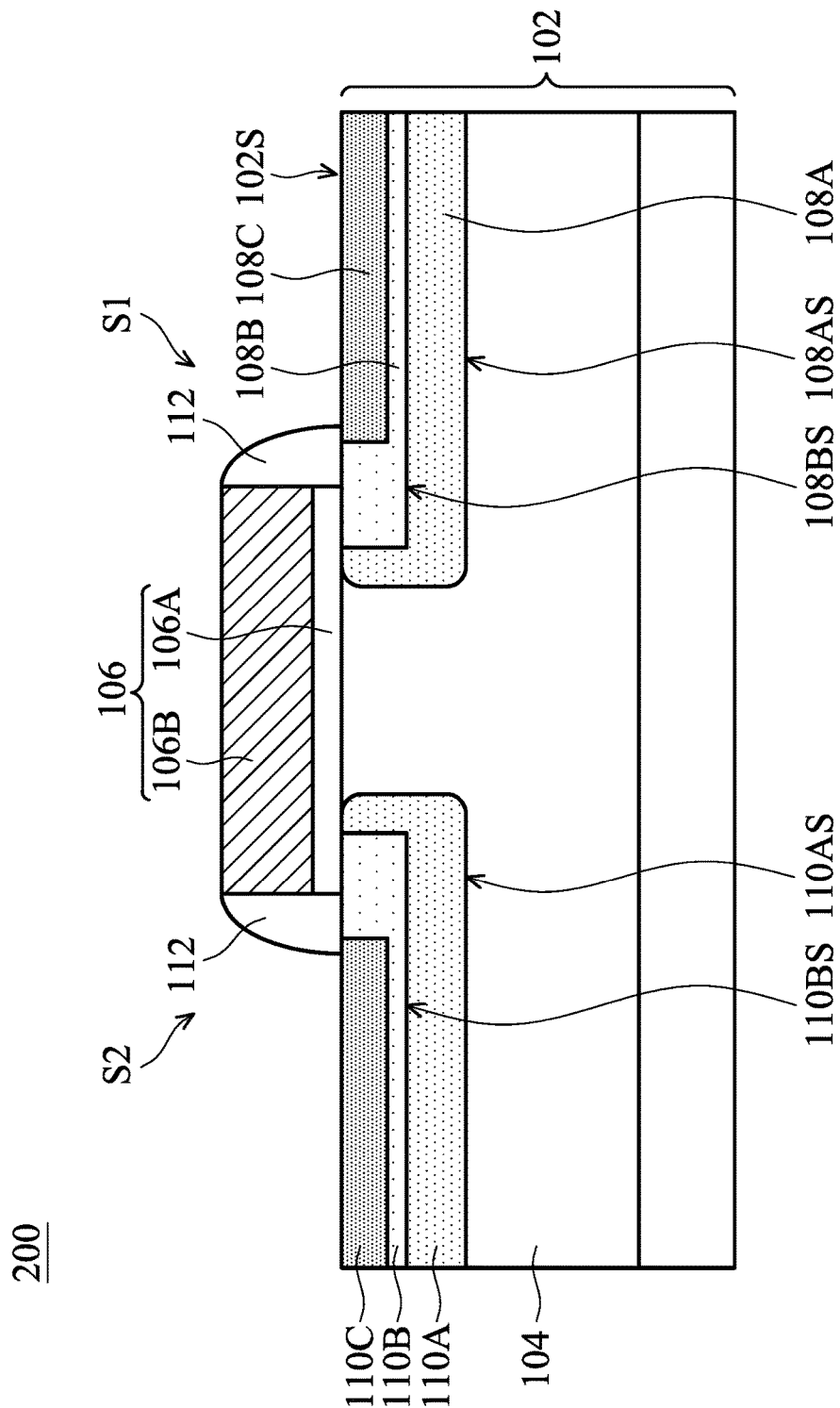
FIG. 2B is a cross-sectional view of a semiconductor device in one step of a manufacturing method of the semiconductor device in accordance with another embodiment of the present disclosure.

It should be noted that the exemplary embodiment set forth in FIGS. 1A-1F is merely for the purpose of illustration. In addition to the embodiment set forth in FIGS. 1A-1F, the semiconductor device 100 may further include a second conductive type second doped region disposed in the lightly-doped source region, as shown in FIGS. 2A-2B. Therefore, the inventive concept and scope are not limited to the exemplary embodiment shown in FIGS. 1A-1F. This will be described in detail in the following description.

Note that the same or similar elements or layers corresponding to those of the semiconductor device are denoted by like reference numerals. The same or similar elements or layers denoted by like reference numerals have the same meaning and will not be repeated for the sake of brevity.

FIG. 2A is a cross-sectional view of a semiconductor device in one step of a manufacturing method of the semiconductor device in accordance with another embodiment of the present disclosure. As shown in FIG. 2A, before forming the spacer, a second conductive type second doped region 110B may be formed in the lightly-doped source region 110A first. The second conductive type second doped region 110B has the second conductive type. Subsequently, the semiconductor device 200 in FIG. 2B is formed through the steps similar to that shown in FIGS. 1E-1F.

In some embodiments, when the second conductive type is N-type, the predetermined region in the substrate 102 for the second conductive type second doped region 110B may be implanted with a P-type dopant (first conductive type dopant) such as boron ion or indium ion to form the second conductive type second doped region 110B.

In addition, as shown in FIG. 2B, the heavily-doped source region 110C is disposed in the second conductive type second doped region 110B. In addition, in some embodiments, the doping concentration of the heavily-doped source region 110C is greater than the doping concentration of the lightly-doped source region 110A, and the doping concentration of the lightly-doped source region 110A is greater than the doping concentration of the second conductive type second doped region 110B.

By forming the second conductive type second doped region 110B in the lightly-doped source region 110A, the substrate current may be further reduced, which in turn increases the structural reliability of the semiconductor device even further.

In some embodiments, the doping concentration of the second conductive type second doped region 110B may be from about $10^{15}/cm^3$ to about $10^{17}/cm^3$, for example about $10^{16}/cm^3$. In addition, in some embodiments, the doping concentration of the second conductive type second doped region 110B is about 0.8-0.001 times the doping concentration of the lightly-doped source region 110A, for example about 0.08-0.03 times the doping concentration of the lightly-doped source region 110A. It should be noted that, in the present disclosure, the doping concentration of the second conductive type second doped region 110B is referred to as the equivalent concentration of the second conductive type dopant in this region. In other words, the doping concentration of the second conductive type second doped region 110B is equal to the doping concentration of the second conductive type dopant of the lightly-doped source region 110A minus the concentration of the first conductive type dopant doped in the step for forming the second conductive type second doped region 110B.

It should be noted that, if the second conductive type second doped region 110B is too great, for example greater than 0.8 times the doping concentration of the lightly-doped source region 110A, the second conductive type second doped region 110B cannot effectively enlarge the area of the depletion region. However, if the second conductive type second doped region 110B is too small, for example smaller than 0.001 times the doping concentration of the lightly-doped source region 110A, the internal resistance of the semiconductor device 100 would increase.

In addition, in some embodiments, as shown in FIG. 2B, the second conductive type second doped region 110B extends from the main surface 102S of the substrate 102 into the lightly-doped source region 110A. In addition, in some embodiments, the lightly-doped source region 110A and the second conductive type second doped region 110B both extend into the first conductive type well region 104 under the gate structure 106.

In addition, in some embodiments, as shown in FIG. 2B, the lightly-doped source region 110A completely encloses the second conductive type second doped region 110B. In other words, except for the sidewalls and the main surface 102S of the substrate 102, the side 110BS of the second conductive type second doped region 110B does not contact the side 110AS of the lightly-doped source region 110A.

In other words, the difference between the embodiments shown in FIGS. 2B and 1F is that the semiconductor device 200 further includes the second conductive type second doped region 110E disposed in the lightly-doped source region 110A. In addition, the heavily-doped source region 110C is disposed in the second conductive type second doped region 110B. In addition, in some embodiments, as shown in FIG. 2B, the second conductive type second doped region 110B completely encloses the heavily-doped source region 110C.

Figure 3:
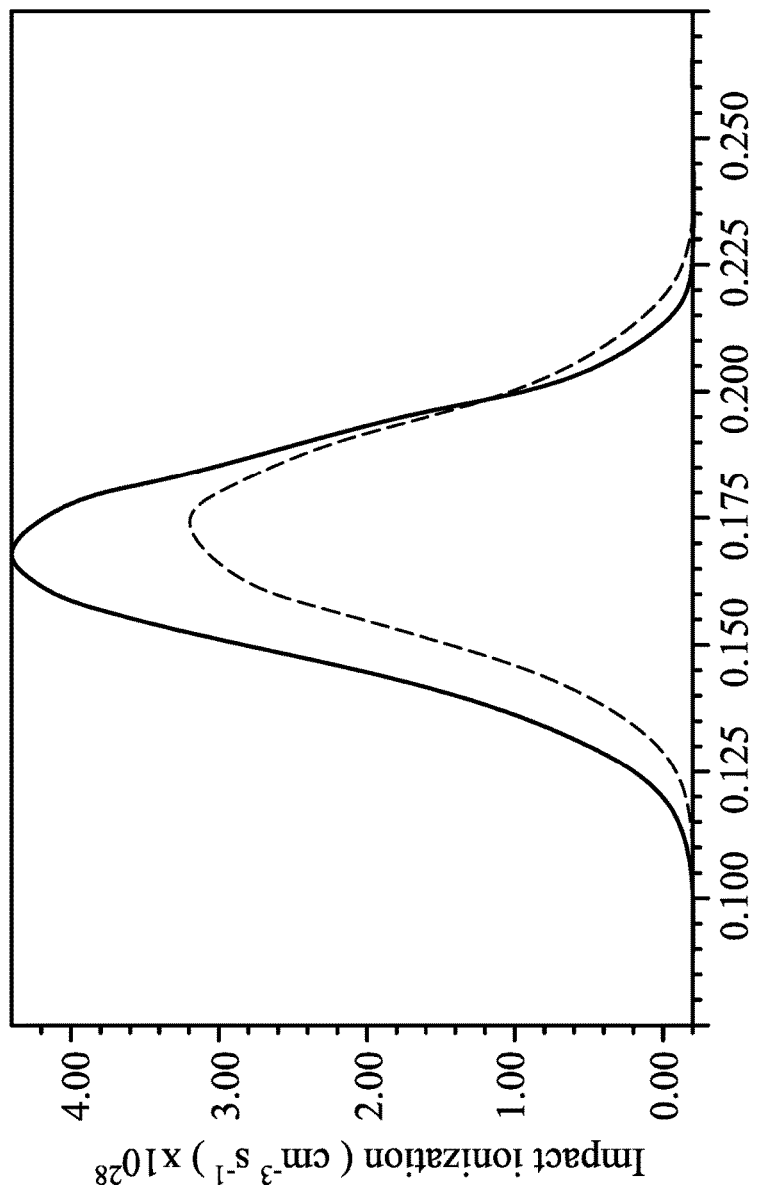
FIG. 3 is an analytical figure of the impact ionization in accordance with some embodiments of the present disclosure.

FIG. 3 is a simulation analytical figure of the impact ionization in accordance with some embodiments of the present disclosure along line 3-3 of semiconductor device 100 in FIG. 1F. This impact ionization refers to the extent of the previous described hot carrier effect and the substrate current resulting from this hot carrier effect. The direction of the horizontal axis in FIG. 3 is the direction of the line 3-3. The direction of the vertical axis in FIG. 3 refers to the extent of the impact ionization (i.e. hot carrier effect).

In addition, the solid line in FIG. 3 refers to the comparative example in which the aforementioned second conductive type first doped region and second conductive type second doped region are not formed. The dashed line in FIG. 3 refers to the example in which the aforementioned second conductive type first doped region is formed in the lightly-doped drain region. As shown in FIG. 3, the formation of the second conductive type first doped region in the lightly-doped drain region may greatly reduce the substrate current, which in turn increases the structural reliability of the semiconductor device.

Figure 4:
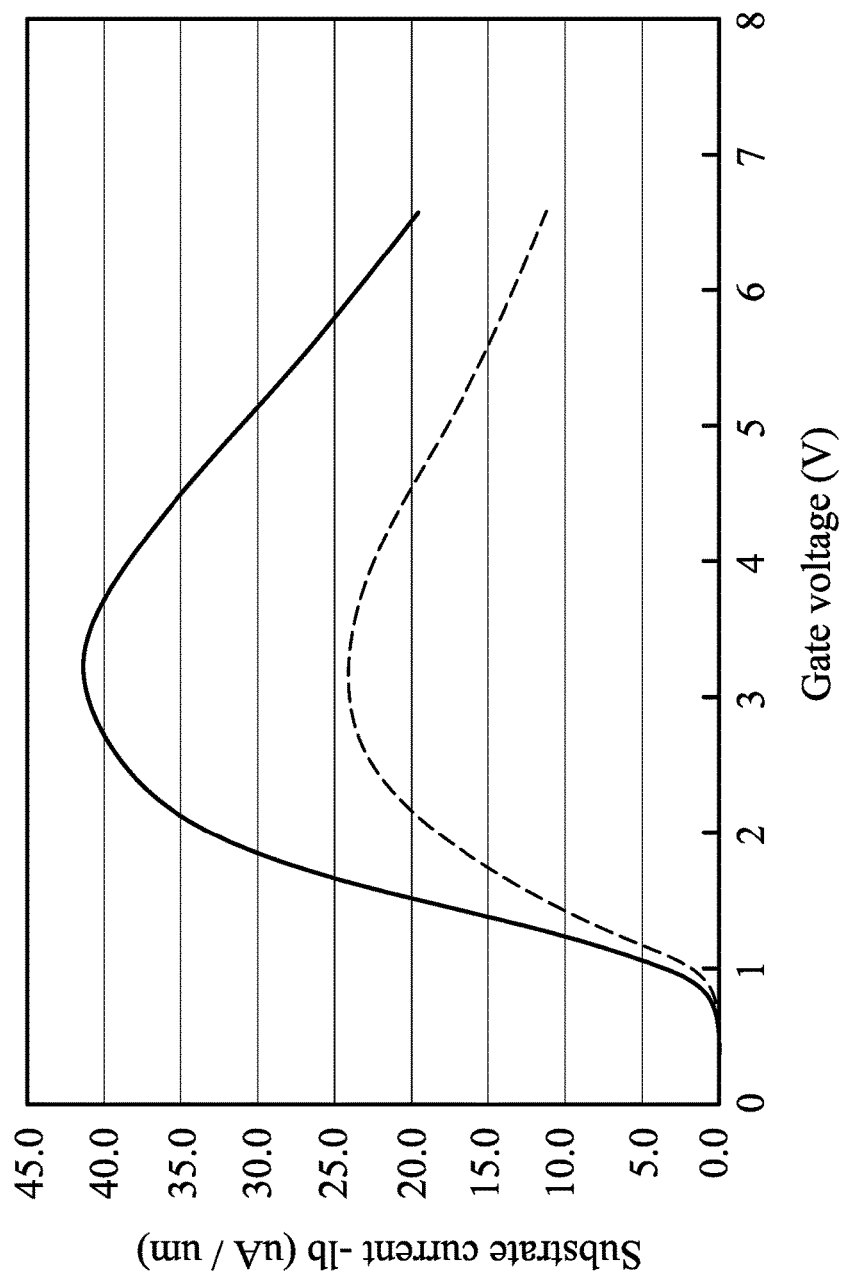
FIG. 4 is an analytical figure of gate voltage versus substrate current in accordance with some embodiments of the present disclosure.

FIG. 4 is a simulation analytical figure of gate voltage versus substrate current in accordance with some embodiments of the present disclosure. The solid line in FIG. 4 refers to the comparative example in which the aforementioned second conductive type first doped region and second conductive type second doped region are not formed. The dashed line in FIG. 4 refers to the example in which the aforementioned second conductive type first doped region is formed in the lightly-doped drain region. As shown in FIG. 4, the formation of the second conductive type first doped region in the lightly-doped drain region may greatly reduce the substrate current, which in turn increases the structural reliability of the semiconductor device.

It should be noted that although the above description merely illustrates embodiments with the first conductive type being P-type and the second conductive type being N-type, those skilled in the art will appreciate that the first conductive type may be N-type with the second conductive type being P-type.

In summary, the embodiment of the present disclosure forms a second conductive type first doped region in the lightly-doped drain region in the semiconductor device, wherein the second conductive type first doped region has a doping concentration that is less than the doping concentration of the lightly-doped drain region, and thereby enlarges the area of the depletion region between the lightly-doped drain region and the first conductive type well region of the substrate in the device. The enlargement the area of the depletion region may decrease the changing rate of the electric field in one unit width in the semiconductor device, which in turn decreases the substrate current resulting from the hot carrier effect. Therefore, the damage to the elements (for example the gate dielectric layer) in the device resulting from the substrate current may be reduced, which in turn increases the structural reliability of the semiconductor device. In addition, by forming the second conductive type second doped region in the lightly-doped source region, the substrate current may be reduced even further, which in turn further increases the structural reliability of the semiconductor device.

Note that the above element sizes, element parameters, and element shapes are not limitations of the present disclosure. Those skilled in the art can adjust these settings or values according to different requirements. It should be understood that the semiconductor device and method for manufacturing the same of the present disclosure are not limited to the configurations of FIGS. 1A to 2B. The present disclosure may merely include any one or more features of any one or more embodiments of FIGS. 1A to 2B. In other words, not all of the features shown in the figures should be implemented in the semiconductor device and method for manufacturing the same of the present disclosure.

In addition, although the doping concentrations of various doped region in some embodiments have been described previously, one skilled in the art will recognize that the doping concentrations of various doped region depend upon the specific device type, technology generation, minimum feature size, and the like. It is intended, therefore, that the doping concentrations of various doped region may be interpreted in light of the technology being evaluated and not be limited to the described embodiments.

It will be apparent to those skilled in the art that various modifications and variations can be made to the disclosed embodiments. It is intended that the specification and examples be considered as exemplary only, with the true scope of the disclosure being indicated by the following claims and their equivalents.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate, wherein the substrate comprises a first conductive type well region;
a gate structure disposed over a main surface of the substrate and over the first conductive type well region, wherein the gate structure comprises a gate electrode and a gate dielectric layer directly under the gate electrode;
a lightly-doped drain region and a lightly-doped source region disposed in the first conductive type well region at two opposite sides of the gate structure, wherein the lightly-doped drain region and the lightly-doped source region have a second conductive type, wherein the second conductive type is different from the first conductive type;
a second conductive type first doped region disposed in the lightly-doped drain region, wherein the second conductive type first doped region has the second conductive type, and a doping concentration of the second conductive type first doped region is less than a doping concentration of the lightly-doped drain region, and wherein the gate dielectric layer directly under the gate electrode physically contacts the second conductive type first doped region and the lightly-doped drain region, forming a first contact area of the second conductive type first doped region and the gate dielectric layer and a second contact area of the lightly-doped drain region and the gate dielectric layer, wherein the first contact area and the second contact area are directly under the gate electrode and between two lateral ends of the gate electrode;
a spacer disposed at the two opposite sides of the gate structure and disposed over the first conductive type well region;
a heavily-doped source region disposed in the lightly-doped source region, wherein the heavily-doped source region has the second conductive type; and
a heavily-doped drain region disposed in the second conductive type first doped region, wherein the heavily-doped drain region has the second conductive type, wherein the heavily-doped drain region extends into the first conductive type well region under the spacer, and does not extend into the first conductive type well region under the gate structure,
wherein the heavily-doped drain region is in direct contact with the spacer, a portion of the spacer is laterally spaced apart from the heavily-doped drain region, and an edge of the heavily-doped drain region is between opposite sidewalls of the spacer.

2. The semiconductor device as claimed in claim 1, wherein a doping concentration of the heavily-doped drain region is greater than the doping concentration of the lightly-doped drain region, and the doping concentration of the lightly-doped drain region is greater than the doping concentration of the second conductive type first doped region.

3. The semiconductor device as claimed in claim 1, wherein the doping concentration of the second conductive type first doped region is about 0.8-0.001 times the doping concentration of the lightly-doped drain region.

4. The semiconductor device as claimed in claim 1, further comprising:
a second conductive type second doped region disposed in the lightly-doped source region, wherein the heavily-doped source region is disposed in the second conductive type second doped region, and the second conductive type second doped region has the second conductive type.

5. The semiconductor device as claimed in claim 4, wherein a doping concentration of the heavily-doped source region is greater than a doping concentration of the lightly-doped source region, and the doping concentration of the lightly-doped source region is greater than a doping concentration of the second conductive type second doped region.

6. The semiconductor device as claimed in claim 4, wherein a doping concentration of the second conductive type second doped region is about 0.8-0.001 times a doping concentration of the lightly-doped source region.

7. The semiconductor device as claimed in claim 1, wherein the lightly-doped drain region completely encloses the second conductive type first doped region.

8. The semiconductor device as claimed in claim 1, wherein a side of the second conductive type first doped region does not contact a side of the lightly-doped drain region.

9. The semiconductor device as claimed in claim 1, wherein the lightly-doped drain region and the second conductive type first doped region both extend into the first conductive type well region under the gate structure.

10. The semiconductor device as claimed in claim 1, wherein the second conductive type first doped region extends from the main surface of the substrate into the lightly-doped drain region.

11. A method for manufacturing a semiconductor device, comprising:
providing a substrate, wherein the substrate comprises a first conductive type well region;
forming a gate structure over a main surface of the substrate and over the first conductive type well region, wherein the gate structure comprises a gate electrode and a gate dielectric layer directly under the gate electrode;
forming a lightly-doped drain region and a lightly-doped source region in the first conductive type well region at two opposite sides of the gate structure, wherein the lightly-doped drain region and the lightly-doped source region have a second conductive type, wherein the second conductive type is different from the first conductive type;
forming a second conductive type first doped region in the lightly-doped drain region, wherein the second conductive type first doped region has the second conductive type, and a doping concentration of the second conductive type first doped region is less than a doping concentration of the lightly-doped drain region, and wherein the gate dielectric layer directly under the gate electrode physically contacts the second conductive type first doped region and the lightly-doped drain region, forming a first contact area of the second conductive type first doped region and the gate dielectric layer and a second contact area of the lightly-doped drain region and the gate dielectric layer, wherein the first contact area and the second contact area are directly under the gate electrode and between two lateral ends of the gate electrode;
forming a spacer at the two opposite sides of the gate structure and over the first conductive type well region;
forming a heavily-doped source region in the lightly-doped source region, wherein the heavily-doped source region has the second conductive type; and
forming a heavily-doped drain region in the second conductive type first doped region, wherein the heavily-doped drain region has the second conductive type, wherein the heavily-doped drain region extends into the first conductive type well region under the spacer, and does not extend into the first conductive type well region under the gate structure,
wherein the heavily-doped drain region is in direct contact with the spacer, a portion of the spacer is laterally spaced apart from the heavily-doped drain region, and an edge of the heavily-doped drain region is between opposite sidewalls of the spacer.

12. The method for manufacturing the semiconductor device as claimed in claim 11, wherein a doping concentration of the heavily-doped drain region is greater than the doping concentration of the lightly-doped drain region, and the doping concentration of the lightly-doped drain region is greater than the doping concentration of the second conductive type first doped region.

13. The method for manufacturing the semiconductor device as claimed in claim 11, wherein the doping concentration of the second conductive type first doped region is about 0.8-0.001 times the doping concentration of the lightly-doped drain region.

14. The method for manufacturing the semiconductor device as claimed in claim 11, further comprising:
forming a second conductive type second doped region in the lightly-doped source region, wherein the heavily-doped source region is disposed in the second conductive type second doped region, and the second conductive type second doped region has the second conductive type.

15. The method for manufacturing the semiconductor device as claimed in claim 14, wherein a doping concentration of the heavily-doped source region is greater than a doping concentration of the lightly-doped source region, and the doping concentration of the lightly-doped source region is greater than a doping concentration of the second conductive type second doped region.

16. The method for manufacturing the semiconductor device as claimed in claim 14, wherein a doping concentration of the second conductive type second doped region is about 0.8-0.001 times a doping concentration of the lightly-doped source region.

17. The method for manufacturing the semiconductor device as claimed in claim 11, wherein the lightly-doped drain region completely encloses the second conductive type first doped region.

18. The method for manufacturing the semiconductor device as claimed in claim 11, wherein a side of the second conductive type first doped region does not contact a side of the lightly-doped drain region.

19. The method for manufacturing the semiconductor device as claimed in claim 11, wherein the lightly-doped drain region and the second conductive type first doped region both extend into the first conductive type well region under the gate structure.

20. The method for manufacturing the semiconductor device as claimed in claim 11, wherein the second conductive type first doped region extends from the main surface of the substrate into the lightly-doped drain region.

* * * * *